(12) United States Patent
Komatsu

(10) Patent No.: US 6,342,717 B1
(45) Date of Patent: Jan. 29, 2002

(54) SEMICONDUCTOR DEVICE AND METHOD FOR PRODUCING SAME

(75) Inventor: Hiroshi Komatsu, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/499,610

(22) Filed: Feb. 7, 2000

(30) Foreign Application Priority Data

Mar. 25, 1999 (JP) ............................................ 11-048960

(51) Int. Cl.$^7$ ............................................... H01L 29/72
(52) U.S. Cl. ........................ 257/347; 257/351; 257/365; 257/368; 438/149; 438/157; 438/176; 438/283
(58) Field of Search ................................... 257/347, 351, 257/365, 368; 438/149, 157, 176, 283

(56) References Cited

U.S. PATENT DOCUMENTS 6,043,536 A * 3/2000 Numata et al. ............. 257/347

* cited by examiner

*Primary Examiner*—Edward Wojciechowicz
(74) *Attorney, Agent, or Firm*—Ronald P. Kananen; Rader, Fishman & Grauer PLLC

(57) ABSTRACT

A semiconductor device improving the characteristics of an integrated circuit in which transistors of different operation modes including a dynamic Vth MOS (DV-MOS) are mixed, comprising a plurality of MOSFETs each including a semiconductor active layer formed in an insulating layer on a substrate, a back side gate electrode facing its substrate side surface via a back side gate insulating film, and a front side gate electrode facing the opposite side surface from the semiconductor active layer via a front side gate insulating film, the plurality of MOSFETs including a first MOSFET (CON-MOS) in which the back side gate electrode and the front side gate electrode are insulated and separated from each other and a second MOSFET (DV-MOS) in which the back side gate electrode and the front side gate electrode are electrically connected, the back side gate insulating film of the DV-MOS being thinner than the back side gate insulating film of the CON-MOS.

11 Claims, 9 Drawing Sheets

SEMICONDUCTOR DEVICE AND METHOD FOR PRODUCING SAME

BACKGROUND OF THE INVENTION

1. Field of the Invention

The present invention relates to a semiconductor device having MOSFETs in which semiconductor active layers for forming element active regions have for example silicon-on-insulator (SOI) type substrate separation structures and back side gate electrodes are buried in an insulating layer for substrate separation, and to a method for producing the same. More specifically, the present invention relates to an improvement of the characteristics of a semiconductor device by changing the thickness of the back side gate insulating film.

2. Description of the Related Art

It has been known that complete separation of elements from each other becomes easy by an SOI structure and that suppression of soft-error or latchup peculiar to a complementary metal-oxide-semiconductor (CMOS) transistor becomes possible. Studies have been conducted on increasing the speed and increasing the reliability of CMOS transistor LSIs by an SOI structure having a silicon active layer having a thickness of about 500 nm from a relatively early stage.

Recently it has been learned that by reducing the thickness of the active layer of the SOI structure to about 100 nm and/or controlling also an impurity concentration of the channel to a relatively low state to achieve conditions for substantially the silicon active layer to become fully depleted, further excellent performance such as the suppression of a short channel effect and an improvement of a current drive capability of the MOS transistor can be obtained.

The two leading methods for forming this SOI layer are the separation by implanted oxygen (SIMOX) and using wafer bonding, both of which have become more perfected and have become more well known.

However, these two methods have both advantages and disadvantages at the present time.

In the SIMOX method, the uniformity of thickness of the SOI film is excellent, but in contrast the sharpness of the interface with a buried oxide film is poor, so there remain problems in operating performance, reliability, etc. of the transistor.

On the other hand, an SOI substrate prepared by the wafer bonding method has good characteristics at the buried oxide film interface, but is a complicated process and, in addition, since the SOI film is made thin by polishing, suffers from a problem in controllability of the SOI film thickness if the precision of detection of the end point of the polishing is poor.

The wafer bonding method includes a case where the SOI layer is formed on the entire surface and a case where the SOI layer is separated in the planar direction to form isolated patterns. In the latter case, it is possible to provide a step difference at the substrate to be polished before bonding and use the layer of the insulator (separation region in the plane direction) filled in the depressions as a stop for the detection of the end point of the polishing.

The flow of the process for fabrication of an SOI substrate common to these methods roughly comprises the following four steps:

(a) Planarization and surface treatment of the bonding surfaces (b) Bonding and annealing (c) Grinding (d) Polishing (or selective polishing)

In an SOI substrate prepared in this way, not only can the thickness etc. of the buried insulating film be relatively freely set, but it also becomes possible to form elements and interconnect them on parts to become the active layer of the substrate that can be polished before bonding, and then bury them in the insulating film in advance so as to prepare an LSI having a high degree of integration in which elements are three dimensionally arranged on the two sides of the active layer in the thickness direction.

Further, when fabricating a MOSFET, it is possible to form, buried in the insulating film, not only the front side gate electrode arranged on the front surface side of the silicon active layer via the gate insulating film, but also a second gate electrode. This insulating film buried type gate electrode will be referred to as a "back side gate electrode-." When using the front side gate electrode for signal input, the short channel effect can be suppressed by control from this back side gate electrode, and the threshold voltage, swing width, or gain of the transistor can be controlled. Further, application to an X-MOS (also referred to as a "double gate MOS") using both of the front side gate and the back side gate for signal input to achieve a 2-channel mode transistor becomes possible.

When supplying a bias voltage to the back side gate electrode, in the past there was only the fixed bias method of applying a constant voltage. In recent years the technique of controlling (changing) the bias voltage to be supplied to the back side gate electrode so as to improve the transistor characteristics has been proposed.

With a transistor referred to as a "dynamic Vth MOS" employing this bias application method, the value of the voltage supplied to the back side gate electrode is dynamically controlled according to the input signal, making the threshold voltage Vth relatively high and reduce the leakage current when the transistor is off, and making the threshold voltage Vth relatively low and improve the drive capability when the transistor is on.

Accordingly, if using this "dynamic Vth" technique, the power supply voltage can be reduced without lowering the operating speed of the transistor and then the leakage current during stand-by can be reduced to enable a reduction of the power consumption of the semiconductor device using the related transistor for an active element.

FIG. 12 shows a sectional view of the principal parts of a semiconductor device of the configuration of the related art. This FIG. 12 shows two transistors having different operation modes, that is, a "dynamic Vth MOS transistor" (hereinafter referred to as a "DV-MOS") and a MOS transistor of in a conventional operation mode (hereinafter referred to as a "CON-MOS").

In a semiconductor device 100 shown in FIG. 12, an insulating layer 103 is formed on a supporting substrate 101 via a bonding layer 102.

At the surface side in the insulating layer 103 are formed a silicon active layer 104 for the CON-MOS and a silicon active layer 105 for the DV-MOS separated from each other. Predetermined impurities are added to the silicon active layers 104 and 105 with a relatively low concentration.

In the insulating layer 102 are buried a back side gate electrode 107 facing a bottom surface of the CON-MOS silicon active layer 104 via a back side gate insulating film 106, and a back side gate electrode 109 facing a bottom surface of the DV-MOS silicon active layer 105 via a back side gate insulating film 108 separated from each other. The back side gate insulating films 106 and 108 are made of silicon oxide films having the same thickness. Further, the back side gate electrodes 107 and 109 are made of polycrystalline silicon and doped with predetermined impurities with a relatively high concentration.

On the silicon active layer 104 or 105 is formed a gate electrode 111 of the transistor via a front side gate insulating film 110. Further, on the front surface side in the silicon active layers 104 and 105, though not illustrated, are formed source and drain impurity regions having an LDD structure. An inter-layer insulating film 112 is deposited over the entire surface, the inter-layer insulating film 112 is partially etched through, plugs 113 are buried there, and an interconnection layer 114 is formed thereon.

Summarizing the problems to be solved by the invention, in the semiconductor device 100 of the related art, however, when forming an integrated circuit by mixing the two types of MOSFETs (CON-MOS and DV-MOS) having different operating modes, there was the problem that the electric characteristics of this circuit did not sufficiently draw out the best performances of the transistors.

This is due to the fact that the two types of transistors with the different operation modes each have their own advantages and disadvantages in their characteristics. That is, when looking at the low voltage operation, low power consumption, and other criteria, a DV-MOS is better than a CON-MOS, but a DV-MOS normally uses the back side gate electrode and the front side gate electrode short-circuited, which suffers from the problem that the gate capacity seen from the signal input side becomes large.

When the interconnections are relatively long or many transistors are connected later and have to be simultaneously driven, resulting in an otherwise large load, the increase of the gate capacity does not become so serious a problem and rather the characteristics of the DV-MOS (low voltage operation and low power consumption) are made good use of.

When the interconnections are conversely relatively short or the number of later transistors is small, resulting in a small load, however, use of a CON-MOS having a small gate capacity sometimes makes the circuit characteristics better.

Accordingly, when designing an actual IC, by suitably arranging transistors of different operation modes (CON-MOS and DV-MOS) in one chip according to the load capacity etc., the characteristics of the circuit as a whole are improved.

However, in actuality, no matter how much the designs are optimized in this way, the characteristics of the circuit as a whole are not improved as much as expected.

SUMMARY OF THE INVENTION

An object of the present invention is to provide a semiconductor device improving the characteristics of an integrated circuit using a combination of a mixture of a transistor dynamically changing the voltage supplied to the back side gate electrode and a transistor having a constant voltage supplied to the back side gate electrode and a method for producing the same.

The semiconductor device according to the present invention improves the characteristics of the integrated circuit by changing the thickness of the back side gate insulating film between transistors of different operation modes.

According to a first aspect of the present invention, there is provided a semiconductor device comprising a plurality of MOSFETs each including a semiconductor active layer formed on an insulating layer on a supporting substrate, a back side gate electrode facing the surface of the semiconductor active layer at the supporting substrate side via a back side gate insulating film, and a front side gate electrode facing the surface of the semiconductor active layer at the side opposite to the back side gate electrode via a front side gate insulating film, the plurality of MOSFETs comprising a first MOSFET in which the back side gate electrode and the front side gate electrode are insulated and separated from each other and a second MOSFET in which the back side gate electrode and the front side gate electrode are electrically connected, the back side gate insulating film of the second MOSFET being formed thinner than the back side gate insulating film of the first MOSFET.

Specifically, for example, the first MOSFET has the back side gate electrode connected to a supply line of a predetermined voltage and has the front side gate electrode connected to the signal input line, the second MOSFET has the back side gate electrode and the front side gate electrode both connected to the signal input line.

Further, in the semiconductor device according to the present invention, preferably the back side gate electrodes of the plurality of MOSFETs include two types of back side gate electrodes having conductivities different from each other, and the back side gate insulating film contiguous with one back side gate electrode between the two types of back side gate electrodes is formed thinner than the back side gate insulating film contiguous with the other back side gate electrode.

For example, the other back side gate electrode where the adjoining back side gate insulating film is relatively thick comprises a semiconductor material containing boron as an impurity. This thick insulating film effectively prevent boron, which has a large diffusion coefficient, from penetrating through the back side gate insulating film and reaching the semiconductor active layer.

According to a second aspect of the present invention, there is provided a semiconductor device comprising a plurality of MOSFETs each including a semiconductor active layer formed on an insulating layer on a supporting substrate, a back side gate electrode facing the surface of the semiconductor active layer at the supporting substrate side via a back side gate insulating film, and a front side gate electrode facing the surface of the semiconductor active layer at the side opposite to the back side gate electrode via a front side gate insulating film, the plurality of MOSFETs comprising a first MOSFET in which the back side gate electrode is connected to a supply line of a predetermined voltage and the front side gate electrode is connected to a signal input line and a second MOSFET in which the back side gate electrode is connected to a bias switch circuit for switching a value of a supplied voltage between a time of conduction and a time of nonconduction and the front side gate electrode is connected to a signal input line, the back side gate insulating film of the second MOSFET being formed thinner than the back side gate insulating film of the first MOSFET.

In a semiconductor device having such a structure, the second MOSFET in which the back side gate electrode and the front side gate electrode are electrically short-circuited performs a so-called "dynamic Vth" operation. That is, for example in an n-channel type, the threshold voltage relatively rises and the leakage current at the off time is reduced when the input signal is at a low level and the transistor is nonconductive, while the threshold voltage relatively falls and the drive capability is improved when the input signal is at a high level and the transistor is conductive. In order to make such an effect larger, it is effective to make the back side gate insulating film thinner so as to enhance the "controllability" of the back side gate electrode with respect to the semiconductor active layer. Accordingly, in this aspect of the present invention, the back side gate insulating film of the second MOSFET is formed relatively thin.

On the other hand, in the first MOSFET in which a constant voltage is supplied to the back side gate electrode, if the back side gate insulating film becomes too thin, a sub-threshold characteristic of the transistor becomes bad, that is, the amount of change of the gate voltage required for changing the sub-threshold current by one order of magnitude (sub-threshold coefficient) becomes large, which is not preferred. Further, when considering the diffusion of the impurity from the back side gate electrode and the insulation characteristics and other aspects of reliability, a thick back side gate insulating film is preferred. Accordingly, in this aspect of the present invention, the back side gate insulating film of the first MOSFET is formed relatively thick.

In this way, in the semiconductor device according to this aspect of the present invention, as a result of the fact that the back side gate insulating film thickness is optimized between the first and second MOSFETs, the characteristics of the integrated circuit using the related MOSFETs are enhanced.

According to a third aspect of the present invention, there is provided a method for producing a semiconductor device comprising: a step of forming a back side gate electrode on a substrate to be polished buried in an insulating layer, a step of bonding the substrate to be polished to a supporting substrate from the insulating layer side, a step of grinding and/or polishing the substrate to be polished from the back side to make the thickness smaller and form the semiconductor active layer, and a step of forming a front side gate electrode on the surface of the semiconductor active layer at the side opposite to the back side gate electrode via the front side gate insulating film, the step for forming the back side gate electrode further including a step of forming a back side gate insulating film having a partially different thickness on the substrate to be polished, a step of forming a plurality of back side gate electrodes on the back side gate insulating film, and a step of depositing an insulating film covering the surfaces of the plurality of back side gate electrodes.

The step of forming the back side gate insulating film includes, for example, a step of forming a first layer of a back side gate insulating film on the substrate to be polished, a step of removing part of the first layer of the back side gate insulating film, and a step of forming a second layer of a back side gate insulating film on the remaining gate insulating film part of the first layer and on the substrate to be polished part exposed by the removal.

Further, preferably, the step of forming the front side gate electrode includes a step of electrically connecting a specific front side gate electrode to a corresponding back side gate electrode according to the thickness of the corresponding back side gate insulating film when simultaneously forming a plurality of front side gate electrodes. For example, when the back side gate insulating film has a first region having a relatively large thickness and a second region having a relatively small thickness, the back side gate electrode and the front side gate electrode formed in an area corresponding to the second region should be electrically connected.

Preferably the back side gate insulating film has a first region having a relatively large thickness and a second region having a relatively small thickness, and, in the step of forming the plurality of back side gate electrodes, a p-type back side gate electrode is formed in the first region and an n-type back side gate electrode is formed in the second region. In this case, the back side gate electrode formed on the first region of the adjoining back side gate insulating film comprises a semiconductor material containing, for example, boron as an impurity. This is because boron penetration can be effectively prevented through the back side gate insulating film and diffusing into the semiconductor active layer by making the back side gate insulating film corresponding to the back side gate electrode containing the boron having a large diffusion coefficient relatively thick.

In such a method of production of a semiconductor device, the step of providing a thickness difference in the back side gate insulating film can be achieved by a combination of lithography and etching. No special step is required.

BRIEF DESCRIPTION OF THE DRAWINGS

These and other objects and features of the present invention will become more apparent from the following description of the preferred embodiments given with reference to the attached drawings, in which.

DESCRIPTION OF THE PREFERRED EMBODIMENTS

Figure 1:
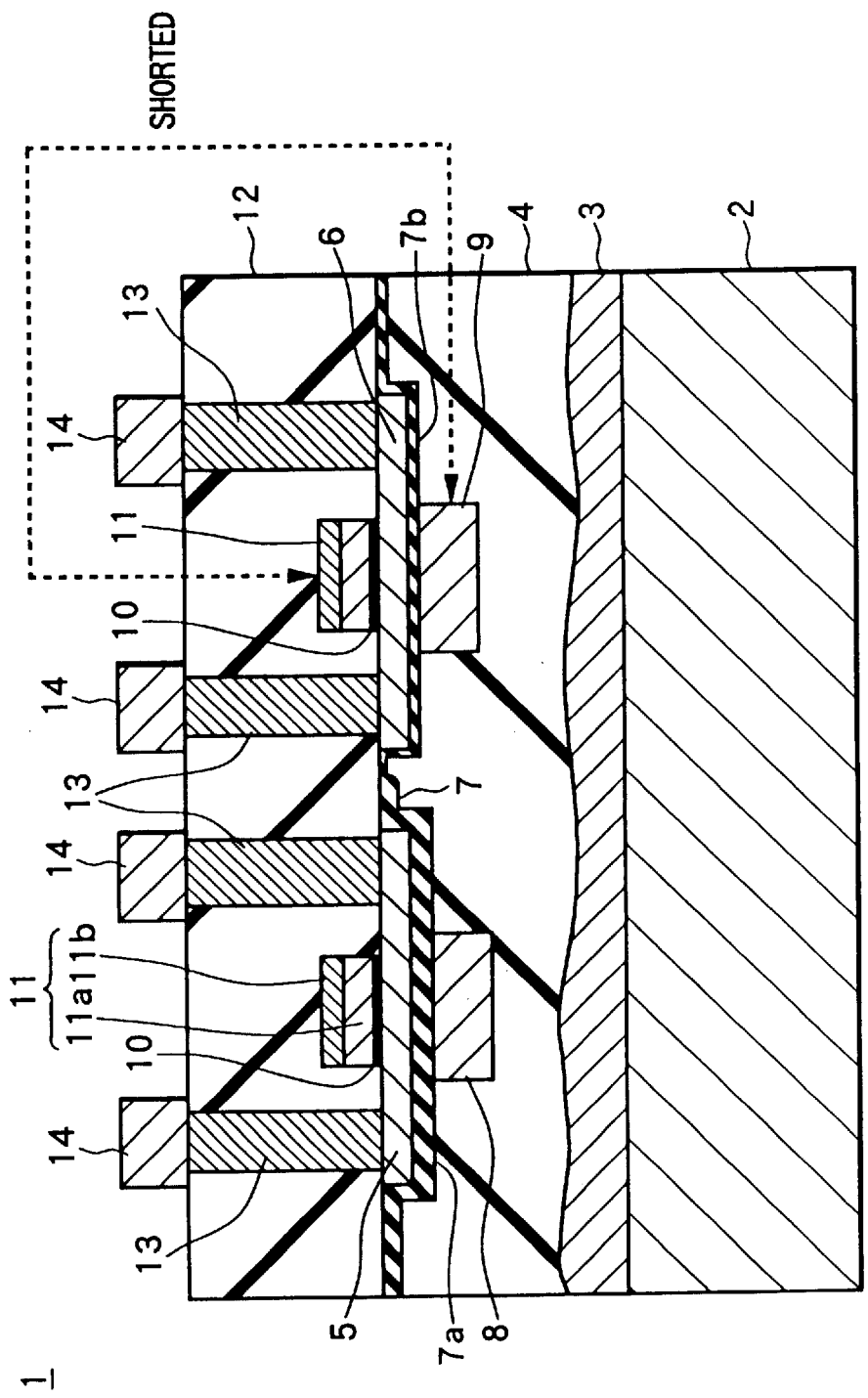
FIG. 1 is a sectional view of transistor portions of different operation modes in a semiconductor device according to an embodiment of the present invention.

FIG. 1 is a sectional view of principal parts of a semiconductor device according to an embodiment of the present invention. In the example of the structure shown in FIG. 1, two MOS transistors of different operation modes, that is, a "dynamic Vth MOS transistor" (hereinafter referred to as a "DV-MOS") and a conventional MOS transistor (hereinafter referred to as a "CON-MOS") are shown.

In a semiconductor device 1 shown in FIG. 1, an insulating layer 4 is formed on a supporting substrate 2 via a bonding layer 3. The supporting substrate 2 may be a silicon wafer or other semiconductor substrate, a glass substrate etc. When the supporting substrate 2 is a silicon wafer, usually polycrystalline silicon is used as the bonding layer 3 and a silicon oxide-based insulating film is used as the insulating layer 4.

A CON-MOS silicon active layer 5 and a DV-MOS silicon active layer 6 are formed and separated from each other on the front side in the insulating layer 4. The silicon active layers 5 and 6 are made of, for example, single crystal silicon doped by a p-type impurity (for example boron) or an n-type impurity (phosphorus or arsenic) at a relatively low concentration.

In the insulating layer 4, a back side gate electrode 8 facing the bottom surface of the CON-MOS silicon active layer 5 via a back side gate insulating film 7a and a back side gate electrode 9 facing the bottom surface of the DV-MOS silicon active layer 6 via a back side gate insulating film 7b are buried and separated from each other.

The back side gate electrodes 8 and 9 each have a thickness of, for example, about 300 nm and are made of polycrystalline silicon doped with an impurity. Here, the CON-MOS back side gate electrode 8 is doped with a p-type impurity at a relatively high concentration in the case of an MOS transistor of an n-type channel (NMOS), and is doped with an n-type impurity at a relatively high concentration in the case of a MOS transistor of a p-type channel (PMOS). On the other hand, the DV-MOS back side gate electrode 9 is doped with an n-type impurity at a relatively high concentration in both cases of an NMOS and PMOS.

The back side gate insulating films 7a and 7b are made of, for example, silicon oxide. The back side gate insulating films 7a and 7b may be separated from each other, but in the present embodiment, one back side gate insulating film 7 having two regions of different thickness is shown. In the present invention, the back side gate insulating film 7a on CON-MOS side in which the thickness is relatively large, for example 60 nm, is referred to as the "first region of the back side gate insulating film 7" and the back side gate insulating film 7b on the DV-MOS side in which the thickness is relatively small, for example 6 nm, is referred to as the "second region of the back side gate insulating film 7".

The gate electrode 11 of the transistor is formed on the silicon active layer 5 or 6 via the front side gate insulating film 10 (thickness: 4 nm). The gate electrode 11 comprises for example a lower layer of polycrystalline silicon 11a (thickness: 100 nm) doped with an impurity of the same conductivity type as that of the channel and an upper layer of a refractory metal silicide 11b (thickness: 100 nm) such as $WSi_x$.

Although not particularly illustrated, a source and drain impurity region having an LDD structure is formed on the front side in the silicon active layers 5 and 6.

An inter-layer insulating film 12 is deposited over the entire surface, the inter-layer insulating film 12 is partially etched through, plugs 13 are buried, and an interconnection layer 14 is formed thereon.

In the semiconductor device 1 having such a sectional structure, the CON-MOS has the back side gate electrode 8 and the front side gate electrode 11 insulated and separated from each other, has the back side gate electrode 8 connected to a predetermined bias voltage supply line, and has the front side gate electrode 11 connected to an input signal line. On the other hand, in the DV-MOS, the back side gate electrode 9 and the front side gate electrode 11 are electrically connected at a not illustrated position and the two connected to an input signal line.

In the semiconductor device 1 having such a structure, the DV-MOS performs a so-called "dynamic Vth" operation since the back side and front side gate electrodes are supplied with the input signal and controlled at the same phase. That is, the threshold voltage Vth relatively rises and the leakage current at the off time is reduced when the input signal is at a low level and the transistor is nonconductive, while the threshold voltage Vth relatively falls and the drive capability is improved when the input signal is at a high level and the transistor is conductive. In the present embodiment, in order to make such an effect larger, the back side gate insulating film 7b is made relatively thin, i.e., 6 nm, so as to raise the "controllability" of the back side gate electrode 9 with respect to the semiconductor active layer 6.

On the other hand, in a CON-MOS in which a constant voltage is supplied to the back side gate electrode 8, if the back side gate insulating film 7a is too thin, a sub-threshold characteristic of the transistor becomes bad, that is, the amount of change of the gate voltage required for changing the sub-threshold current by one order of magnitude (sub-threshold coefficient) becomes large, which is not preferred. Further, when considering the diffusion of the impurity (boron) from the back side gate electrode 8 and the insulation characteristics of the back side gate and other aspects of reliability, a thick back side gate insulating film 7a is preferred. Accordingly, in this embodiment, the back side gate insulating film 7a of the CON-MOS is set relatively thick, i.e., 60 nm. As a result, the sub-threshold coefficient can be lowered to an ideal value of 60 mV/Dec. even at the maximum.

In this way, in the semiconductor device 1 according to the present embodiment of the present invention, the back side gate insulating film thickness is optimized between the two different operation mode transistors (DV-MOS and CON-MOS). As a result, in the semiconductor device 1, an improvement of the characteristics (lower voltage, lower power consumption, higher drive capability, and lower leakage current) of the integrated circuit formed using the two transistors having different operation modes is achieved.

In this semiconductor device 1, a thickness difference is set in the back side gate insulating film for the reason that the conductivity types of the back side gate electrodes are different, for example, as in CMOS transistors, in addition to the reason that the operation modes are different as mentioned above. That is, even between CON-MOS's or between DV-MOS's, a thickness difference is set in the back side gate insulating film between the p-channel MOS and the n-channel MOS.

Figure 2:
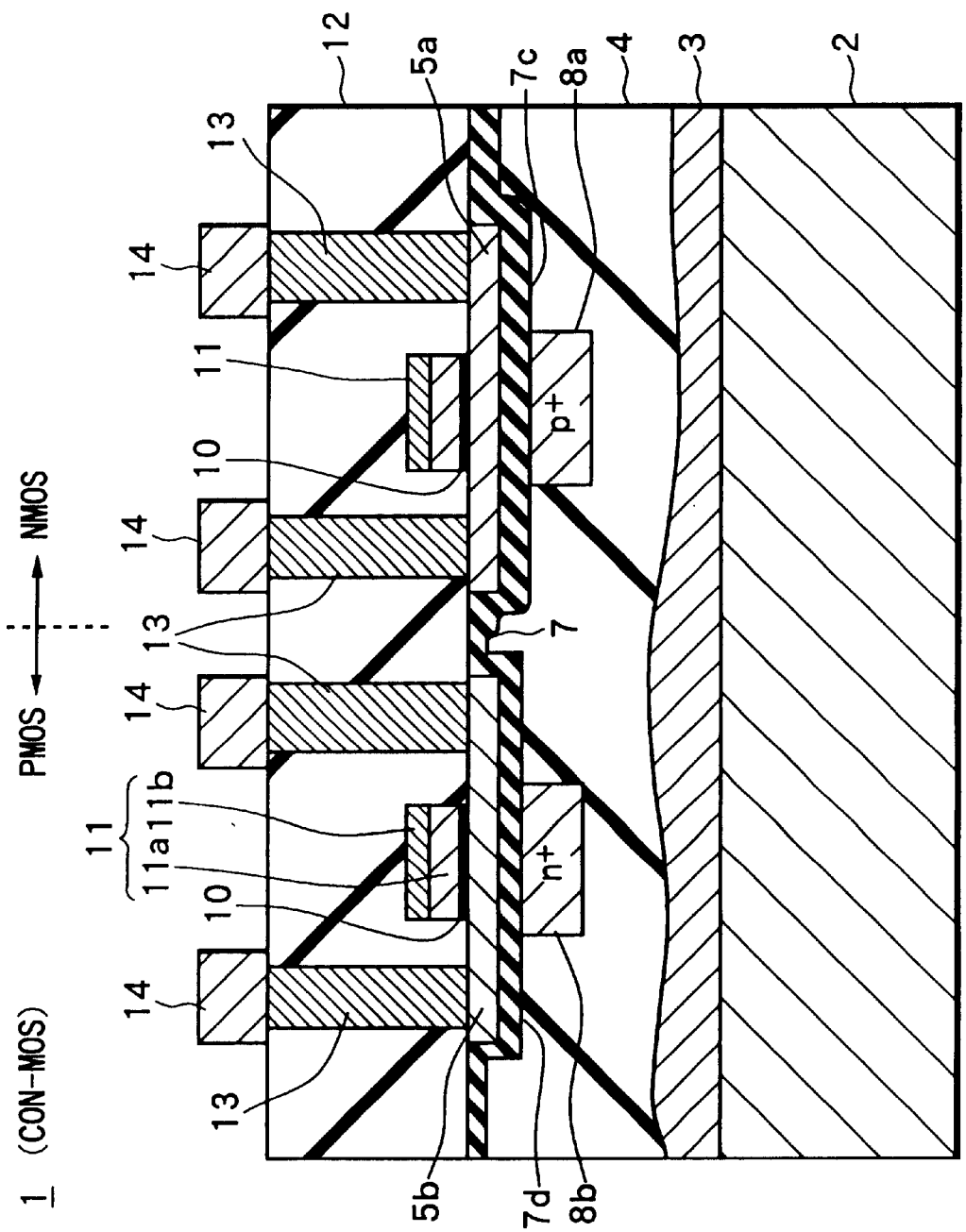
FIG. 2 is a sectional view of a CMOS transistor portion of a semiconductor device according to an embodiment of the present invention.

FIG. 2 is a sectional view of a CMOS transistor portion constituted by the CON-MOS in the semiconductor device 1.

The fundamental structure of the transistor in FIG. 2 is similar to that of FIG. 1, but while the back side gate electrode 8a of the NMOS was doped with a p-type impurity (boron) at a relatively high concentration, the back side gate electrode 8b of the PMOS is doped with an n-type impurity (phosphorus or arsenic) at a relatively high concentration. Then, a region 7c of the back side gate insulating film 7 contiguous with the p+ back side gate electrode 8a is set thicker than a region 7d of the back side gate insulating film 7 contiguous with the n+ back side gate electrode 8b. Specifically, while for example the region 7d of the back side gate insulating film 7 has a thickness of about 60 nm, the region 7c has a thickness of about 100 nm.

In general, when fabricating a CMOS transistor, in order to avoid the formation of a channel near the interface between the silicon active layer and the insulating layer so as to obtain a device of a surface channel type resistant to the short channel effect, the material of the back side gate electrode must be p+ polycrystalline silicon in the NMOS and n+ polycrystalline silicon in the PMOS in view of the work function. That is, when forming the back side gate electrodes, employment of a dual gate process for separately implanting the p+ impurity and the n+ impurity in the polycrystalline silicon becomes indispensable.

In the method for forming a CMOS transistor of the related art, however, after the impurity is doped in the polycrystalline silicon forming the back side gate electrodes by the dual gate process, heat treatment is carried out at a high temperature for a long time in the step of bonding the substrates etc. During this heat treatment, in particular the boron in the p+ polycrystalline silicon is thermally diffused and sometimes penetrates through the back side gate insulating film to reach the silicon active layer. This is because boron has a large diffusion coefficient in silicon and the insulating film when compared with an n-type impurity such as phosphorus and arsenic.

The thermal diffusion of this boron into the silicon active layer not only causes a deviation of the threshold value of the NMOS, but also increases the leakage current at the off time and in some cases causes the disadvantage of formation of a partial depletion type transistor, a susceptibility to the short channel effect, or a lowered drive capability.

As shown in FIG. 2, in the semiconductor device 1 according to the embodiment of the present invention, by making the back side gate insulating film region 7c on the p+ back side gate electrode 8a side (NMOS side) thick in comparison with the back side gate electrode region 7d of the n+ back side gate electrode 8b side (PMOS side), the fluctuation and lowering of the characteristics due to the diffusion of the boron mentioned above are effectively prevented.

Simultaneously, as the result of the fact that the p+ back side gate electrode can be used particularly at the NMOS, there is obtained an advantage that the formation of a back channel when the back side gate electrode 8a has zero bias is suppressed, so punch through accompanying the short channel effect is hard to occur.

Next, an explanation will be made of an embodiment of a method for producing this semiconductor device 1 by referring to the drawings.

FIG. 3 to FIG. 10 are sectional views of the state in the middle of the manufacture of the DV-MOS and CON-MOS as an example of two transistor portions between which a thickness difference is provided in the back side gate insulating film in the semiconductor device 1.

Figure 3:
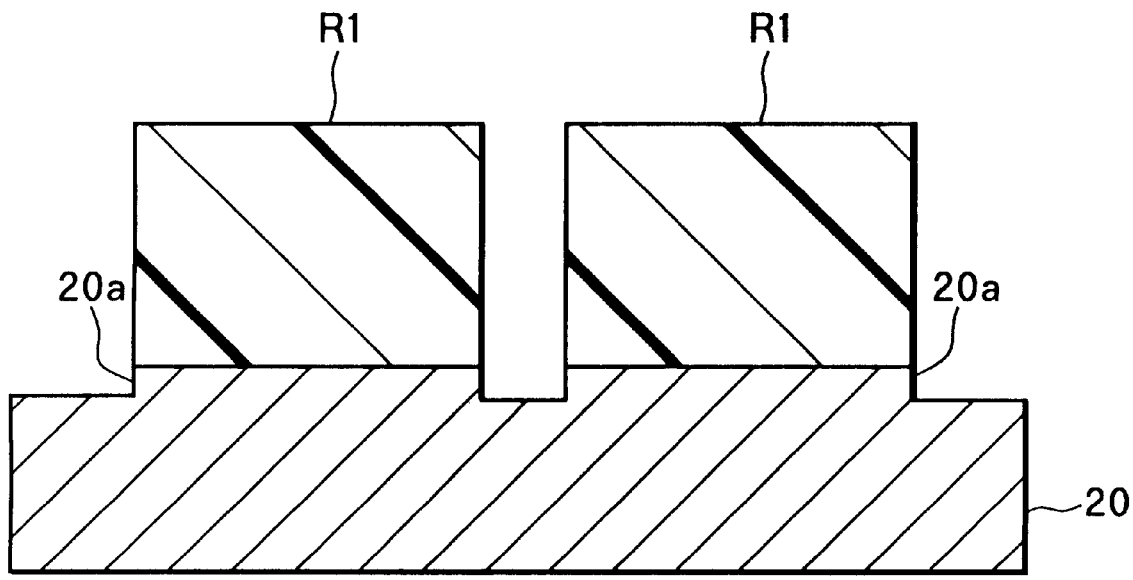
FIG. 3 is a sectional view of the state after etching when forming projections on the substrate to be polished in the production of a semiconductor device according to an embodiment of the present invention.

In FIG. 3, for example a silicon wafer or other substrate to be polished 20 is prepared, a resist pattern R1 is formed on this, the surface of the substrate to be polished 20 is etched (for example by reactive ion etching (RIE)) by using this as a mask, and thereby projections 20a forming the silicon active layers later are formed. The step difference of the projections 20a is set for example at about 70 nm.

Figure 4:
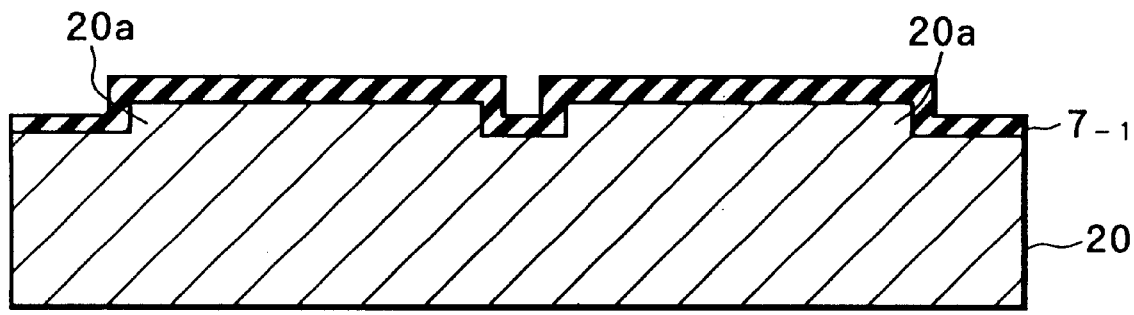
FIG. 4 is a sectional view of the state after the formation of a first layer of a back side gate insulating film after FIG. 3.

The resist pattern R1 is removed, then, in FIG. 4, for example, a thermal oxidation process is used to form a first layer of a back side gate insulating film $7_{-1}$ made of silicon oxide to about 60 nm on the front side of the surface of the substrate to be polished 20 on which the projections 20a are formed. This thermal oxidation is carried out by using for example an atmospheric pressure vertical oxidation system under conditions of an introduction gas of $H_2:O_2=1:1$ and a system temperature of 950° C.

Figure 5:
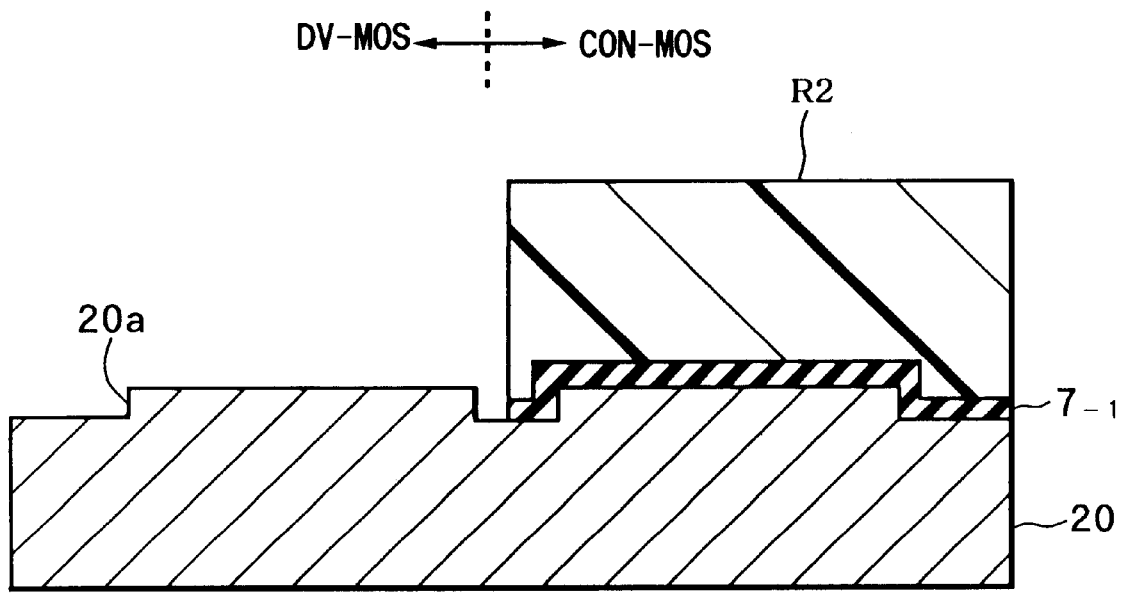
FIG. 5 is a sectional view of the state after the partial etching of the first layer of the back side gate insulating film after FIG. 4.

In FIG. 5, a resist pattern R2 covering only the CON-MOS part is formed on the back side gate insulating film $7_{-1}$, and the back side gate insulating film $7_{-1}$ of the DV-MOS part is removed by wet etching using this as a mask.

Figure 6:
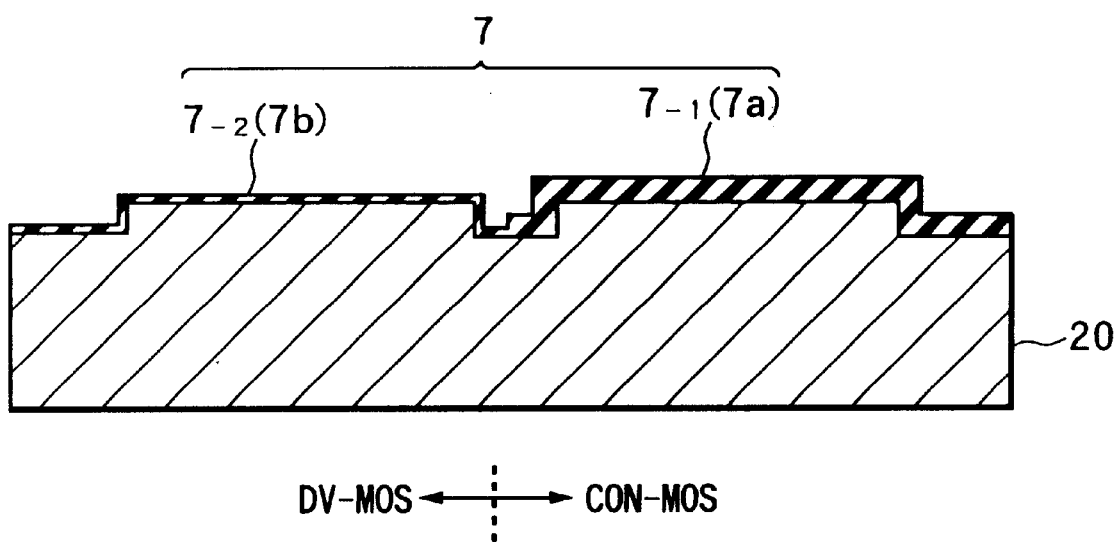
FIG. 6 is a sectional view of the state after the formation of a second layer of a back side gate insulating film after FIG. 5.

The resist pattern R2 is removed, then, in FIG. 6, for example, a thermal oxidation process is used to form a second layer of a back side gate insulating film $7_{-2}$ made of silicon oxide to about 6 nm on the substrate region of the DV-MOS part exposed by the wet etching in the above step. This thermal oxidation is carried out by using for example an atmospheric pressure vertical oxidation system under conditions of an introduction gas of $H_2:O_2=1:1$ and a system temperature of 850° C. In this thermal oxidation, there is almost no thermal oxidation in the CON-MOS part.

As a result, a back side gate insulating film 7 having a CON-MOS part (region 7a of FIG. 1) having a thickness of about 60 nm and a DV-MOS part (region 7b of FIG. 1) having a thickness of about 6 nm, that is, in which the thickness is partially different, is completed.

Figure 7:
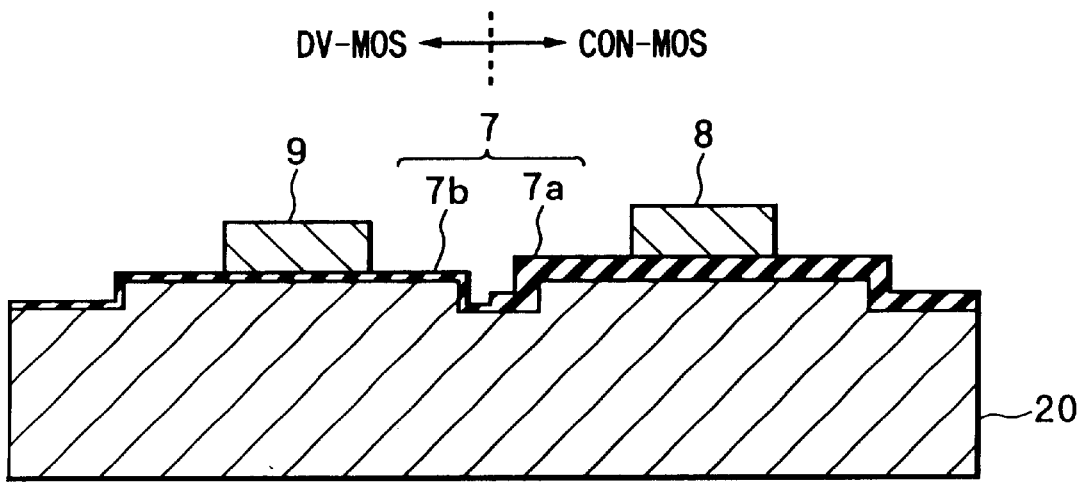
FIG. 7 is a sectional view of the state after the formation of a back side gate electrode after FIG. 6.

In FIG. 7, the polycrystalline silicon for forming the back side gate electrode is deposited (by chemical vapor deposition (CVD)) to about 300 nm, then different ion species are injected using, for example, a resist pattern (not shown) as a mask to introduce the required impurities into predetermined regions of the polycrystalline silicon. Thereafter, another resist pattern (not shown) is formed on the polycrystalline silicon, the polycrystalline silicon is etched using this as a mask, and the resist pattern is removed. By this, the CON-MOS back side gate electrode 8 and the DV-MOS back side gate electrode 9 are formed on the back side gate insulating film 7 while separated from each other.

Figure 8:
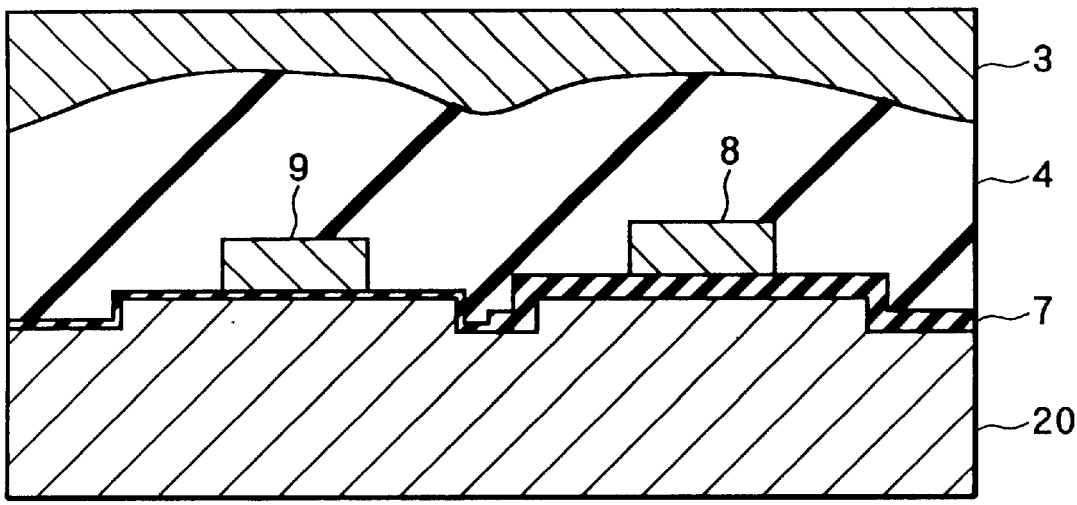
FIG. 8 is a sectional view of the state after the formation and polishing of an insulating layer and a bonding layer after FIG. 7.

In FIG. 8, an insulating layer 4 made of for example silicon oxide is deposited relatively thickly to bury the back side gate electrodes 8 and 9. Further, for example polycrystalline silicon is deposited on the insulating layer 4 and the front surface is polished to form the bonding layer 3.

Figure 9:
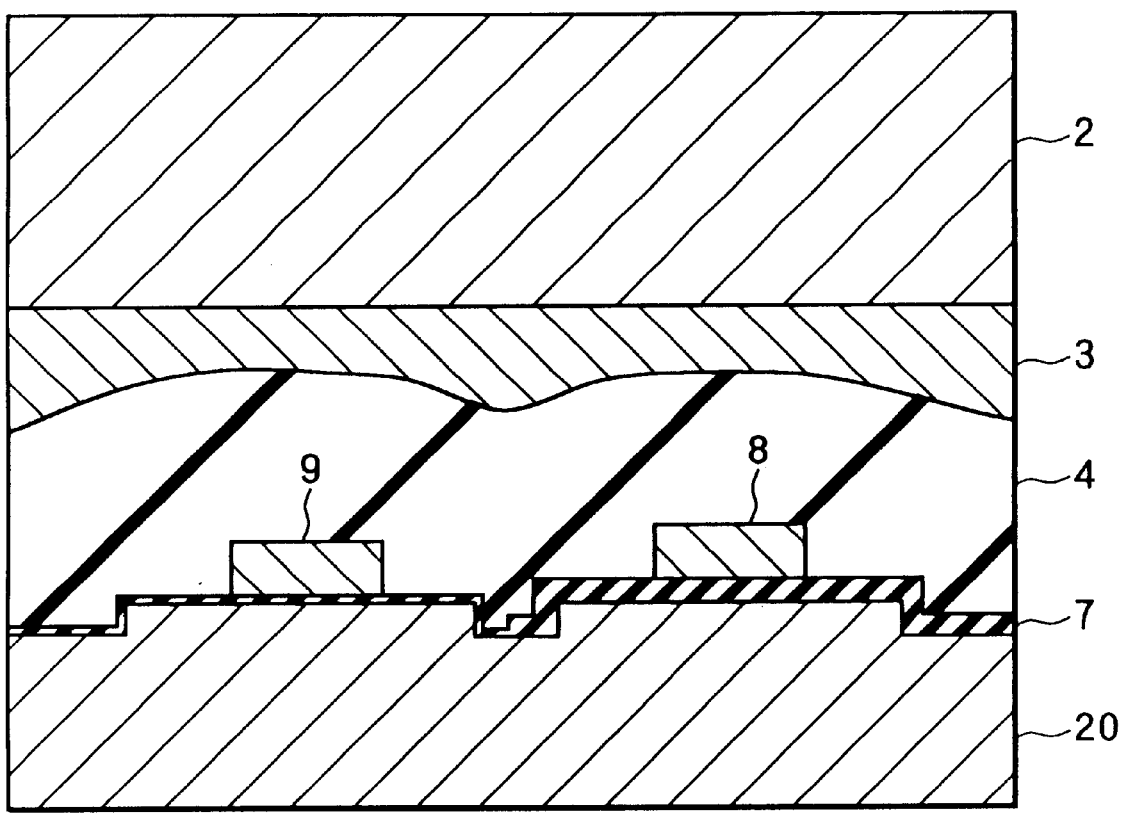
FIG. 9 is a sectional view of the state after the bonding of the substrates after FIG. 8.

In FIG. 9, for example, the substrate to be polished 20 is bonded to the supporting substrate 2 made of the silicon wafer or the like prepared in advance from the planarized surface of the bonding layer 3 and heat treated. The heat treatment at this time is carried out in for example an electric furnace in an oxygen atmosphere under conditions of 1100° C. and 60 min.

The bonded SOI substrate formed in this way is ground and polished (CMP) from the back side of the substrate to be polished 20. In the CMP, at the point of time when the back side gate insulating film 7 is exposed between the projections 20a of the substrate to be polished 20, this acts as a stopper. Accordingly, the polishing does not advance much after this, and the end point of the polishing is detected. By this selective polishing, the projections 20a of the substrate to be polished 20 are separated from each other.

Figure 10:
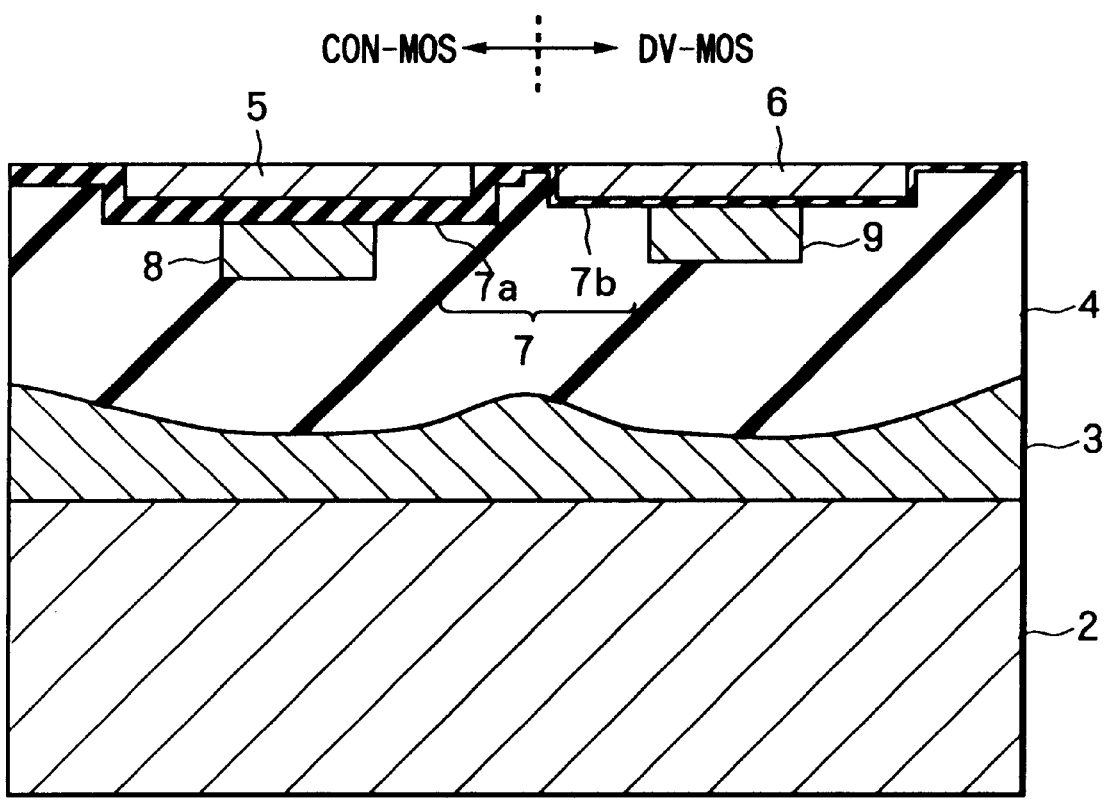
FIG. 10 is a sectional view of the state after chemical mechanical polishing of the substrate to be polished after FIG. 9.

Next, different ion species are injected into the separated projections 20a using for example a resist pattern (not shown) as a mask to introduce the required impurities into the silicon forming the projections 20a. By this, as shown in FIG. 10, the CON-MOS silicon active layer 5 and the DV-MOS silicon active layer 6 are formed insulated and separated from each other.

Thereafter, as shown in FIG. 1, the MOS transistors are formed.

First, the front surfaces of the silicon active layers 5 and 6 are thermally oxidized to form a front side gate insulating film 10 having a thickness of 4 nm. A polycide film forming the gate electrodes is formed on the entire surface and patterned to form the gate electrodes 11. By the ion implantation using the gate electrodes 11 as masks, LDD regions (not illustrated) are formed on the front surfaces of the silicon active layers 5 and 6, then side wall insulating layers (not illustrated) are formed on the two sides of the gate electrodes 11. By the ion implantation using the side wall insulating layers and the gate electrodes 11 as masks, source and drain impurity regions (not illustrated) are formed on the front surfaces in the silicon active layers 5 and 6.

An inter-layer insulating film 12 is deposited thickly on the entire surface including the MOS transistors, then contact holes are opened and plugs 13 made of tungsten or polycrystalline silicon etc. are buried in the contact holes. Then, the interconnection layer 14 is formed on the inter-layer insulating film 12 and the fundamental structure of the related semiconductor device 1 is completed.

In the method for producing a semiconductor device according to this embodiment of the present invention, the process (FIG. 4 to FIG. 6) for providing the thickness difference in the back side gate insulating film 7 can be achieved by the combination of lithography and etching. No special process is required. For this reason, the manufacturing cost is not greatly increased.

Figure 11:
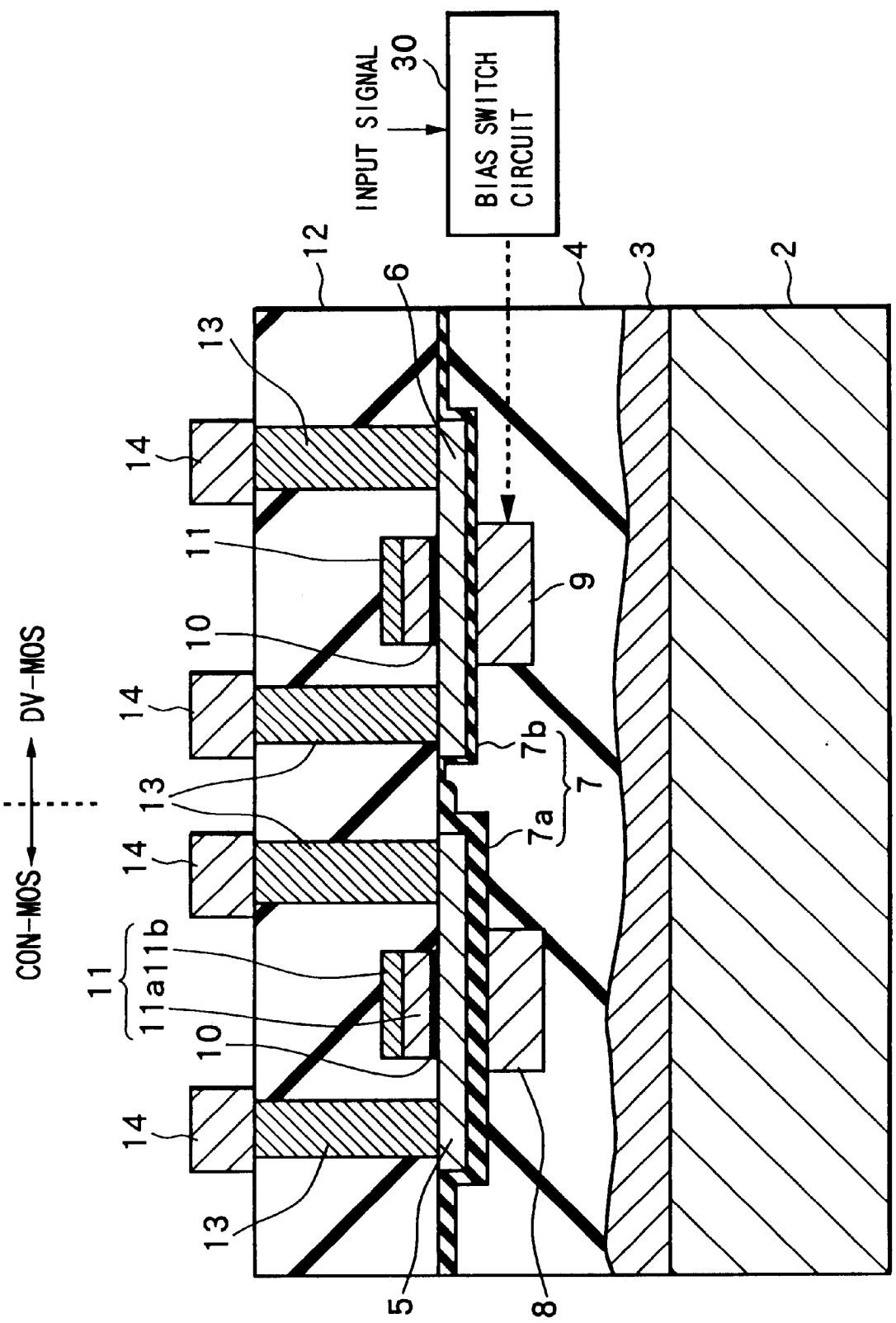
FIG. 11 is a sectional view of a portion of transistors of different operation modes in a semiconductor device according to a modification of an embodiment of the present invention.
Figure 12:
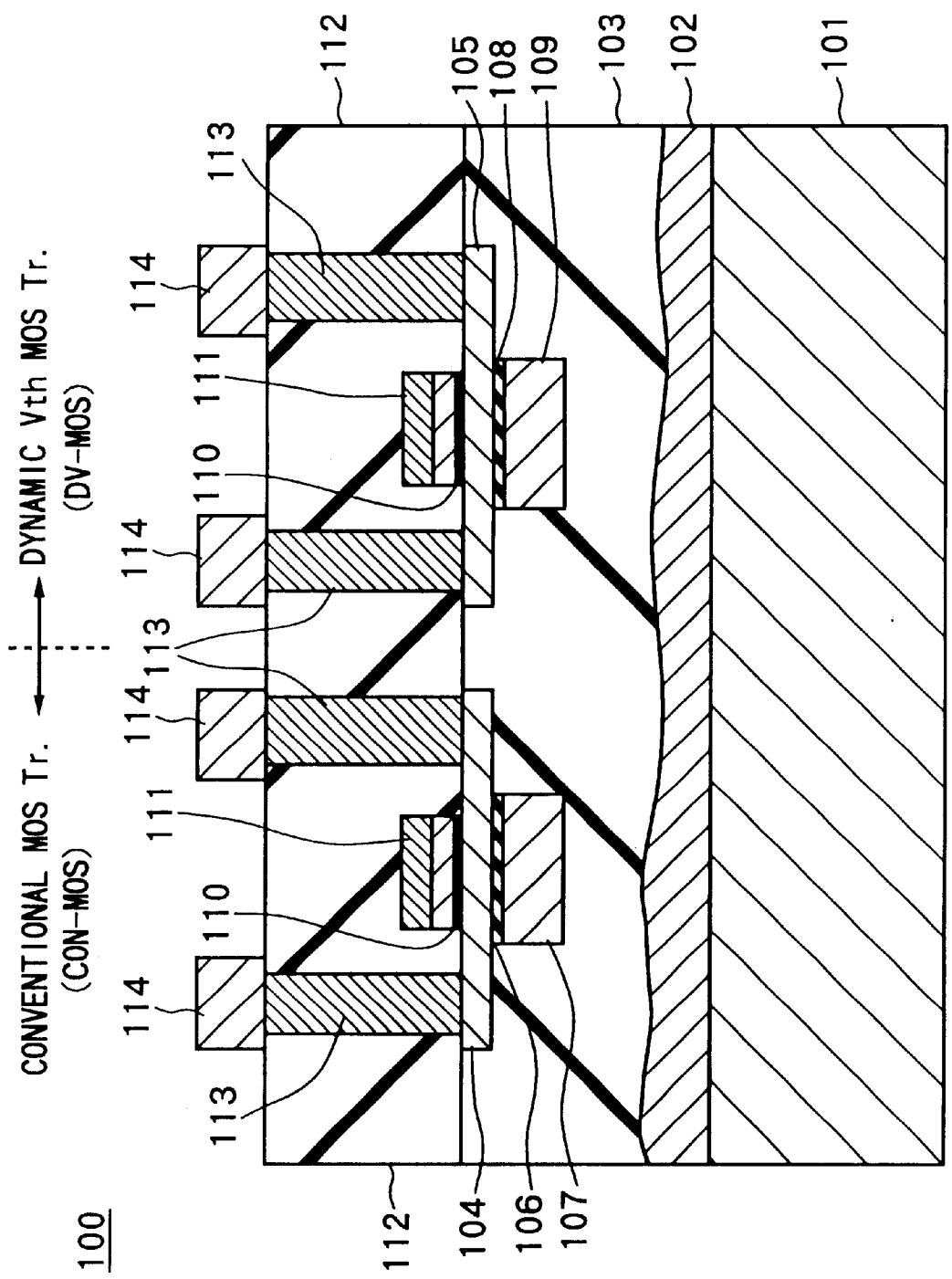
FIG. 12 is a sectional view of a portion of transistors of different operation modes in a semiconductor device having a configuration of the related art.

FIG. 11 is a sectional view of the principal parts of a semiconductor device according to a modification of the embodiment of the present invention.

In this modification, the gate electrodes 9 and 11 of the back side and the front side of the DV-MOS are not directly electrically connected, but for example a bias switch circuit 30 for generating a control signal from the input signal is connected to the back side gate electrode 9. For this reason, the control signal has the same phase as that of for example the input signal input to the front side gate electrode 11, but the controllability of the back side gate electrode 9 with respect to the silicon active layer 6 can be raised by making the amplitude large. Accordingly, in the present modification, there is the advantage that the absolute thickness value of the back side gate insulating film 7b in the DV-MOS can be enlarged by that amount, and the thermal diffusion of the boron into the silicon active layer 6 can be suppressed.

The bias switch circuit 30 is made from an integrated circuit formed in another silicon active layer simultaneously formed with the silicon active layers 5 and 6.

Summarizing the effects of the present invention, according to the semiconductor device according to the present invention and the method for producing the same, back side gate insulating films having optimum thicknesses are provided for transistors having different operation modes. As a result, the flexibility of the design of the integrated circuit using such transistors having different operation modes rises and in addition the characteristics of the integrated circuit can be improved. Specifically, a semiconductor device excellent in points of the low voltage, low power consumption, high drive capability, and low leakage current can be realized.

In addition, since the thickness of the back side gate insulating film is changed according to the type of the impurity to be introduced into the back side gate electrode, the penetration of boron etc. having a large diffusion coefficient to the semiconductor active layer is prevented and thus the generation of a leakage current at the off time and the fluctuation of the threshold value of the transistors can be prevented.

Further, the advantages obtained by complete depletion of the semiconductor active layer, for example, the suppression of the short channel effect (and punch through) and the improvement of the current drive capability are not degraded.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor device comprising a plurality of MOSFETs each including
    a semiconductor active layer formed on an insulating layer on a supporting substrate,
    a back side gate electrode facing a first surface of the semiconductor active layer at a supporting substrate side via a back side gate insulating film, and
    a front side gate electrode facing a second surface of the semiconductor active layer at a side opposite to the back side gate electrode via a front side gate insulating film,
    the plurality of MOSFETs comprising a first MOSFET in which the back side gate electrode and the front side gate electrode are insulated and separated from each other and
    a second MOSFET in which the back side gate electrode and the front side gate electrode are electrically connected,
    the back side gate insulating film of the second MOSFET being formed thinner than the back side gate insulating film of the first MOSFET.

2. A semiconductor device as set forth in claim 1, wherein:
    the first MOSFET has the back side gate electrode connected to a supply line of a predetermined voltage and has the front side gate electrode connected to a signal input line, and
    the second MOSFET has the back side gate electrode and the front side gate electrode both connected to the signal input line.

3. A semiconductor device as set forth in claim 1, wherein:
    the back side gate electrodes of the plurality of MOSFETs include two types of back side gate electrodes having conductivities different from each other, and
    the back side gate insulating film is contiguous with one back side gate electrode between the two types of back side gate electrodes and is formed thinner than the back side gate insulating film that is contiguous with the other back side gate electrode.

4. A semiconductor device as set forth in claim 3, wherein the other back side gate electrode where the adjoining back side gate insulating film is relatively thick comprises a semiconductor material containing boron as an impurity.

5. A semiconductor device comprising a plurality of MOSFETs each including
    a semiconductor active layer formed on an insulating layer on a supporting substrate,
    a back side gate electrode facing a first surface of the semiconductor active layer at the supporting substrate side via a back side gate insulating film, and
    a front side gate electrode facing a second surface of the semiconductor active layer at a side opposite to the back side gate electrode via a front side gate insulating film,
    the plurality of MOSFETs comprising:

a first MOSFET in which the back side gate electrode is connected to a supply line of a predetermined voltage and the front side gate electrode is connected to a signal input line and a second MOSFET in which the back side gate electrode is connected to a bias switch circuit for switching a value of a supplied voltage between a time of conduction and a time of nonconduction and the front side gate electrode is connected to a signal input line, the back side gate insulating film of the second MOSFET being formed thinner than the back side gate insulating film of the first MOSFET.

6. A method for producing a semiconductor device comprising:

forming a back side gate electrode on a substrate to be polished buried in an insulating layer, bonding the substrate to be polished to a supporting substrate at the insulating layer side, grinding and/or polishing the substrate to be polished from a substrate back side to make the thickness smaller and a forming a semiconductor active layer, and forming a front side gate electrode on the surface of the semiconductor active layer at the side opposite to the back side gate electrode via the front side gate insulating film, the step for forming the back side gate electrode further including:

forming a back side gate insulating film having a partially different thickness on the substrate to be polished, forming a plurality of back side gate electrodes on the back side gate insulating film, and depositing an insulating film covering the surfaces of the plurality of back side gate electrodes.

7. A method for producing a semiconductor device as set forth in claim 6, wherein the step of forming the back side gate insulating film includes:

forming a first layer of a back side gate insulating film on the substrate to be polished, removing part of the first layer of the back side gate insulating film, and forming a second layer of a back side gate insulating film on the remaining gate insulating film part of the first layer and on the substrate to be polished part exposed by the first layer film removal.

8. A method for producing a semiconductor device as set forth in claim 6, wherein the step of forming the front side gate electrode includes a step of electrically connecting a specific front side gate electrode to a corresponding back side gate electrode according to the thickness of the corresponding back side gate insulating film when simultaneously forming a plurality of front side gate electrodes.

9. A method for producing a semiconductor device as set forth in claim 8, wherein:

the back side gate insulating film has a first region having a relatively large thickness and a second region having a relatively small thickness and the back side gate electrode and the front side gate electrode formed in an area corresponding to the second region are electrically connected.

10. A method for producing a semiconductor device as set forth in claim 6, wherein:

the back side gate insulating film has a first region having a relatively large thickness and a second region having a relatively small thickness and in the step of forming the plurality of back side gate electrodes, a p-type back side gate electrode is formed in the first region and an n-type back side gate electrode is formed in the second region.

11. A method for producing a semiconductor device as set forth in claim 10, wherein the back side gate electrode formed on the first region of the adjoining back side gate insulating film comprises a semiconductor material containing boron as an impurity.

* * * * *

UNITED STATES PATENT AND TRADEMARK OFFICE
CERTIFICATE OF CORRECTION

| | | |
|---|---|---|
| PATENT NO. | : 6,342,717 B1 | Page 1 of 1 |
| DATED | : January 29, 2002 | |
| INVENTOR(S) | : Hiroshi Komatsu | |

It is certified that error appears in the above-identified patent and that said Letters Patent is hereby corrected as shown below:

<u>Title page,</u>
Item [30], Foreign Application Priority Data should read
--      Feb. 25, 1999 (JP) ........................ 11-048960 --.

Signed and Sealed this

Twenty-sixth Day of November, 2002

Attest:

Attesting Officer

JAMES E. ROGAN
*Director of the United States Patent and Trademark Office*